United States Patent
Nieminen

(10) Patent No.: US 7,213,194 B2
(45) Date of Patent: May 1, 2007

(54) METHOD AND ARRANGEMENT FOR DECODING A CONVOLUTIONALLY ENCODED CODEWORD

(75) Inventor: Esko Nieminen, Oulu (FI)

(73) Assignee: Nokia Corporation, Espoo (FI)

( * ) Notice: Subject to any disclaimer, the term of this patent is extended or adjusted under 35 U.S.C. 154(b) by 715 days.

(21) Appl. No.: 09/896,637

(22) Filed: Jun. 29, 2001

(65) Prior Publication Data

US 2002/0012408 A1    Jan. 31, 2002

(30) Foreign Application Priority Data

Jun. 30, 2000    (FI) ............................. 20001571 U

(51) Int. Cl.
*H03M 13/03*    (2006.01)
(52) U.S. Cl. ...................................... 714/794; 714/795
(58) Field of Classification Search ................ 714/794, 714/795
See application file for complete search history.

(56) References Cited

U.S. PATENT DOCUMENTS

| | | | | |
|---|---|---|---|---|
| 4,872,168 A | * | 10/1989 | Aadsen et al. ............... | 714/720 |
| 5,432,803 A | | 7/1995 | Liu et al. ........................ | 371/43 |
| 5,721,745 A | | 2/1998 | Hladik et al. .................. | 371/43 |
| 5,933,462 A | * | 8/1999 | Viterbi et al. ................ | 375/341 |
| 6,484,283 B2 | * | 11/2002 | Stephen et al. ............. | 714/786 |

FOREIGN PATENT DOCUMENTS

| | | |
|---|---|---|
| EP | 0963048 A2 | 12/1999 |
| EP | 0964527 A1 | 12/1999 |
| EP | 0967730 A1 | 12/1999 |
| WO | WO 99/34520 | 7/1999 |
| WO | WO 00/10254 | 2/2000 |
| WO | WO 00/57560 | 9/2000 |

OTHER PUBLICATIONS

"Near Shannon Limit Error-Correcting Coding: Turbo Codes", Proc. IEEE Int. Conf. Commun., pp. 1064-1070, 1993.
"A Simplification Of The Modified Bahl Decoding Algorithm For Systematic Convolutional Codes", ISITA 1994, pp. 1073-1077.
"Soft-Output Decoding Algorithms In Iterative Decoding Of Turbo Codes", TDA Progress Report, pp. 42-124, 1996.
"Real-Time Algorithms and VLSI Architectures for Soft Output MAP Convolutional Decoding", Dawid et al., International Symposium on Personal, Indoor and Mobile Radio Communication PIMRC'95, pp. 193-197.

* cited by examiner

*Primary Examiner*—Joseph D. Torres
(74) *Attorney, Agent, or Firm*—Perman & Green LLP

(57) ABSTRACT

An arrangement and method for decoding a convolutionally encoded codeword employs a window sliding over the codeword. Path metrics are computed simultaneously forwards and backwards in the sliding window. A decoding result is computed in a synthesis unit on the basis of the path metrics. The sliding window is divided into four parts. Path metrics are computed in the forward direction in the first part of the sliding window and stored in a four-part memory. Path metrics are computed in the backward direction in two other parts of the sliding window in such a way that the input of the computation units comes from the fourpart memory; the computed metrics are applied to the synthesis unit; and a decoding result is computed.

5 Claims, 4 Drawing Sheets

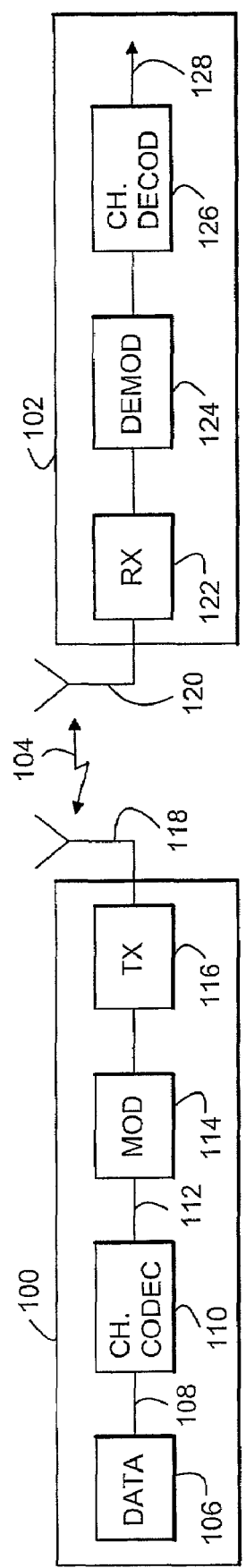
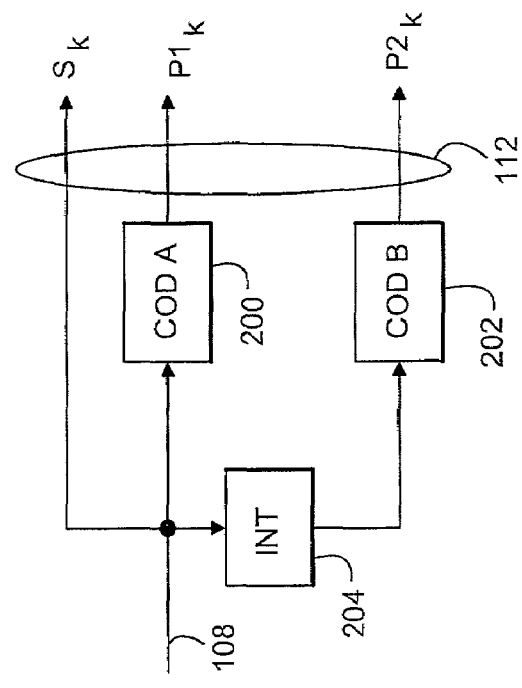
Fig. 1
Fig. 2a

METHOD AND ARRANGEMENT FOR DECODING A CONVOLUTIONALLY ENCODED CODEWORD

FIELD OF THE INVENTION

The invention relates to a method and an arrangement for decoding a convolutionally encoded codeword.

BACKGROUND OF THE INVENTION

The transmission channel used for data transmission in telecommunication systems frequently causes disturbance for data transmission. Disturbance occurs in all kinds of systems, but in wireless telecommunication systems, in particular, the transmission path attenuates and distorts the signal to be transmitted in many ways. Disturbance on the transmission path is typically caused by multi-path propagation of a signal, different kinds of fading and reflection and also by signals transmitted on the same transmission path.

In order to reduce the effect of the disturbance, various encoding methods have been provided, the purpose of which is to protect the signal against disturbance and to eliminate errors caused by the disturbance in a signal. One efficient encoding method is convolutional encoding. In convolutional encoding the signal to be transmitted, consisting of symbols, is encoded into codewords by convolving the symbols to be transmitted with polynomials of a code. The convolutional code is defined by a coding rate and coding polynomials. The coding rate (k/n) refers to the number of the encoded symbols (n) in relation to the number of the symbols to be encoded (k). The encoder is often implemented by means of shift registers. The constraint length K of the code often refers to the length of the shift register. The encoder may be regarded as a state machine with $2^K$ states.

One encoding method further developed from the convolutional encoding method is a parallel concatenated convolutional code PCCC, which is called a turbo code. One way to form a PCCC code is to use two recursive systematic convolutional encoders and an interleaver. The convolutional encoders may be similar or different. The resulting code comprises a systematic part, which directly corresponds to the symbols at the input of the encoder, and two parity parts, which form the outputs of the parallel convolutional encoders.

The function of the receiver is thus to decode the encoded signal, which has propagated over the transmission path and has often been distorted in many ways. The convolutional code is generally decoded by means of a trellis corresponding to the state machine of the encoder. The trellis expresses the states of the encoder and the transitions between the states with the required codewords.

The purpose of the decoder is thus to determine the sequential states, i.e. the transitions, of the encoder from one state to another. In order to determine the transitions in the decoder, branch metrics are used, which illustrate the probabilities of different transitions. The branch metrics are proportional to the logarithms of the transition probabilities. Hence, the sums of the metrics correspond to the sums of the probabilities. Small metrics correspond to a high probability.

In connection with turbo codes, in particular, iterative decoding methods are applied, which use soft bit decisions. A soft decision comprises a bit decision and a probability that the decision is correct. These methods are usually based on the known Maximum A Posteriori (MAP) algorithm, which functions by means of symbols. The original MAP algorithm, disclosed in connection with turbo codes in publication Berrou, Glavieux, Thitimajshima: *Near Shannon limit error-correcting coding; Turbo codes*, Proc. IEEE Int. Conf. Commun., Geneva, Switzerland, pp. 1064–1070, 1993, for example, is too complex to be implemented in telecommunication systems in practice. It has been further developed into what is known as a MaxLogMap method, described in the following publications, for example: S. S. Pietrobon S. A. Barbulescu, *A Simplification of the Modified Bahl Decoding Algorithm for Systematic Convolutional Codes*, ISITA 1994, Sydney, NSW, pp. 1073–1077, November 1994, and S. Benedetto, D. Divsalar, G. Montorsi, F. Pollara, *Soft-Output Decoding Algorithms in Iterative Decoding of Turbo Codes*, TDA Progress report pp. 42–124, Feb. 15, 1996.

The use of both the MAP and the MaxLogMap involves an extensive memory requirement. In iterative computation, data is taken from the preceding iteration to the next iteration round in the form of an extrinsic weight coefficient. In order to compute the weight coefficient, one must know the values of the path metrics in the trellis, computed both forwards and backwards. In both directions, the current values of the path metrics are computed on the basis of the preceding values, and the computation goes in opposite directions along the received signal. This means that the metrics of one direction of travel should be stored in a memory to await the computation going in the opposite direction. For example, if the number of the original uncoded bits is N=5,000 and an eight-state code is used, the amount of the available memory should be 8*N, i.e. 4,000 units, and assuming that the word width is 16 bits, the memory requirement would be 80 kB, which is a large amount, implemented by means of today's techniques. The exemplary numerical values used herein correspond to parameters of novel telecommunication systems.

The memory requirement can be reduced by using what is known as the sliding window principle. Here, for example, the metrics to be computed forwards are computed as a continuous function, whereas the metrics going backwards are computed inside the window sliding over the received signal to be transmitted. The problem relating to this is that at the end of the window (seen from the direction of forward-going computation) the values of the metrics to be computed backwards are not known. However, this problem is eliminated by the well known feature of path metrics, according to which, irrespective of the values used at the beginning, the numerical values converge into the correct values after path metrics have been computed for a while. "Learning" period computation must therefore be performed at the beginning; in other words, there is a warm-up period, after which the correct values are found. The length of the learning period depends on the constraint length of the code. It is well known that a good result is achieved if the learning period is about five times the constraint length of the code.

Solutions of this kind utilizing the sliding window technique are disclosed in the above-mentioned publication by S. Benedetto et al. and in U.S. Pat. No. 5,933,462, for example. The amount of required memory may thus be reduced. However, there are still other drawbacks in the solutions disclosed. The solutions require a relatively complex control system and multi-port memory elements from which several memory locations can be read simultaneously.

BRIEF DESCRIPTION OF THE INVENTION

An object of the invention is thus to implement a method and an arrangement implementing the method for advantageously decoding a convolutional code. This is achieved by a method of decoding a convolutionally encoded codeword by means of a window sliding over the codeword, which method comprises computation of path metrics simultaneously forwards and backwards in the sliding window and computation of a decoding result in a synthesis unit on the basis of the path metrics.

In the method according to the invention, a) a four-part sliding window is used; b) path metrics are computed in the forward direction in the first part of the sliding window, and the path metrics are stored in a four-part memory; c) the path metrics are computed in the backward direction in two other parts of the sliding window in such a way that the input of the computation units comes from the four-part memory; d) the metrics computed are applied to a synthesis unit, and a decoding result is computed; e) the sliding window is moved one part forwards; and f) steps a) to e) are repeated.

The invention also relates to an arrangement for decoding a convolutionally encoded codeword over the codeword by means of a sliding window, which arrangement comprises a first memory for storing the codeword; first, second and third computation means for computing path metrics forwards and backwards; a synthesis unit for computing a decoding result on the basis of the path metrics; and a second memory element for temporary storage of the path metrics.

In the arrangement according to the invention, the first computation means are arranged to read codeword symbols from the first memory, to compute path metrics in the forward direction in the first part of the four-part sliding window of a given length and to store the path metrics in the second memory; the output of the second memory is connected to the inputs of the second and third computation means; the second and third computation means are arranged to compute path metrics in the backward direction in two other parts of the sliding window; the outputs of the second and third computation means and the output of the second memory are functionally connected to the input of the synthesis unit; and the arrangement comprises control means, which are arranged to move the sliding window one part forwards, until the end of the codeword is reached.

Preferred embodiments of the invention are disclosed in the dependent claims.

A sliding window is thus applied in a solution according to the invention. Thanks to this, the amount of the required memory is small. In solutions according to preferred embodiments of the invention, the sliding window is divided into four parts and moved forwards by a quarter step. The computed forward-going path metrics are stored into the four-part memory, the storing always going in the same direction, and the input data of the backward-going path metrics is read from the four-part memory, always going in the same direction, yet in the direction opposite to the direction of storing the forward-going metrics. The solution first applies computation of forward-going metrics to the received signal and only after this computation of backward-going metrics.

A solution utilizing a four-part window is preferable in the sense that it is easy to control the writing and reading in the memory, because there is no need to change writing and reading directions when the window moves. Another significant advantage is that the signal memory does not have to be a double-port memory, because the signal is read once per sample during one round. This is done when the forward-going metrics are being computed. The backward-computing metrics units read data stored by the forward-going metrics unit from the auxiliary memory.

BRIEF DESCRIPTION OF THE DRAWINGS

The invention will now be described in more detail in connection with preferred embodiments, with reference to the attached drawings, of which FIG. 1 illustrates an example of a convolutional encoder transmitter and a receiver, to which the solution according to the invention can be applied;

FIGS. 2a and 2b illustrate an example of a structure of a turbo encoder and a turbo decoder;

DETAILED DESCRIPTION OF THE INVENTION

Figure 2B:
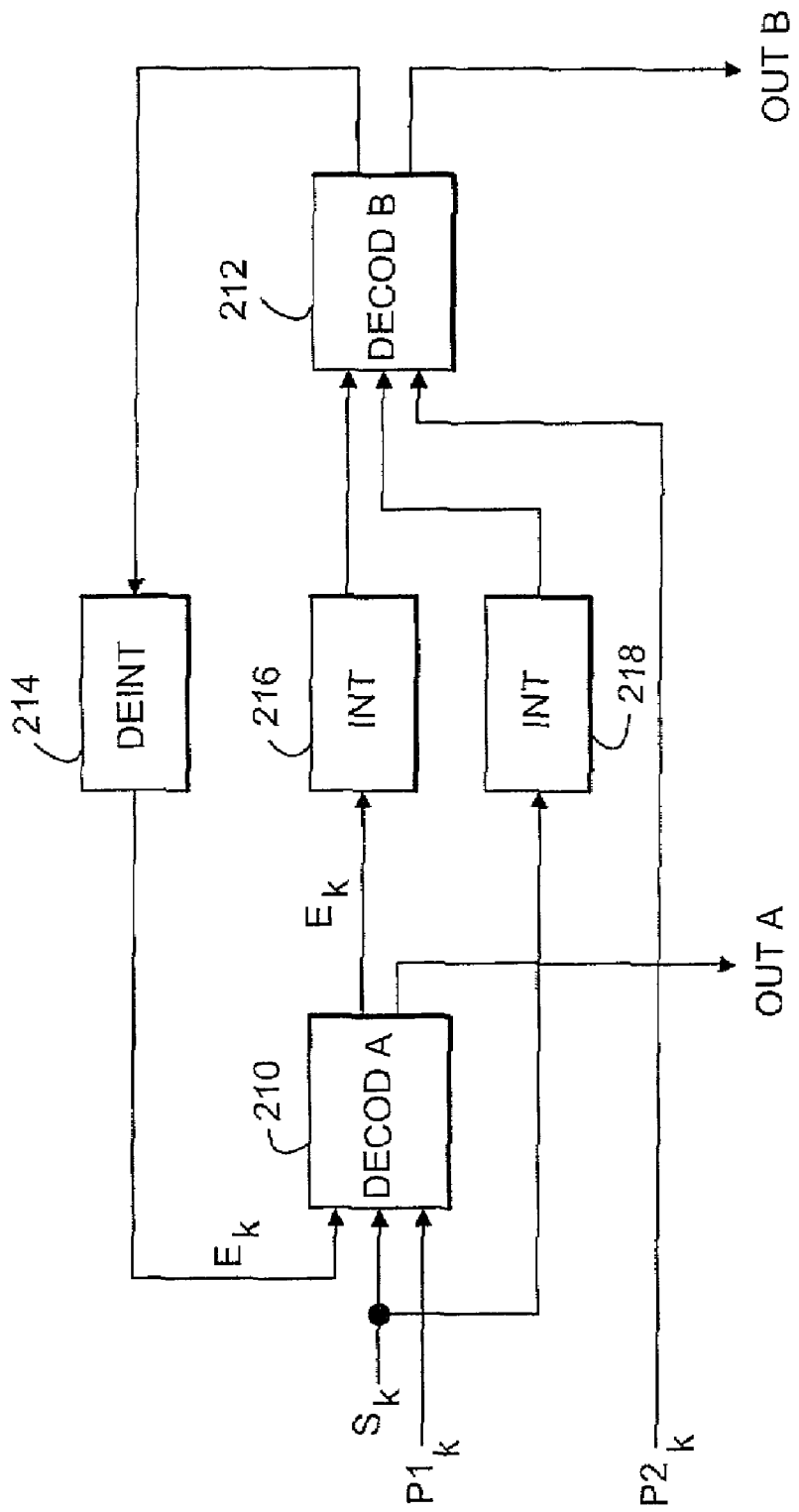

With reference to FIG. 1, let us first study an example of a transmitter 100 and a receiver 102, in connection with which a solution according to preferred embodiments of the invention can be applied. In the example of FIG. 1, the transmitter 100 and the receiver 102 communicate via a radio channel 104. The transmitter 100 comprises a data source 106, which may be a voice encoder or some other data source. A signal 108 to be transmitted is received from the output of the data source, which signal is applied to a channel encoder 110, in this case a convolutional encoder, preferably a turbo encoder. The encoded symbols 112 are applied to a modulator 114, in which the signal is modulated in a known manner. The modulated signal is applied to radio frequency parts 116, in which it is amplified and sent to the radio channel 104 by means of an antenna 118.

On the radio channel 104 the signal is affected by disturbances and typically also some noise. The receiver 102 comprises an antenna 120, by means of which it receives the signal, the signal being applied to a demodulator 124 through radio frequency parts 122. The demodulated signal is applied to a channel decoder 126, in which it is subjected to decoding according to preferred embodiments of the invention. From the encoder, the decoded signal 128 is further applied to other parts of the receiver.

FIG. 2a illustrates the structure of a typical turbo encoder. The encoder comprises two encoders 200, 202 and an interleaver 204. The signal 108 to be encoded is applied as such to the output of the encoder. This component is called systematic part S of the code. The signal to be encoded is also applied as such to the first encoder A 200 and to the interleaver 204. The interleaved signal is applied to the second encoder B 202. The output signal P1 of the first encoder and the output signal P2 of the second encoder are called parity parts of the code. The encoders A and B may be similar or different. Their structure is according to the prior art.

FIG. 2b illustrates the general structure of a typical turbo encoder when there is a 1/3 code. The systematic part $S_k$ and the parity parts $P1_k$ and $P2_k$ of the code enter the decoder as an input. The decoder comprises two decoder units, a first unit A 210 and a second unit B 212. The systematic part $S_k$, the parity part $P1_k$ and the extrinsic weight coefficient $E_k$ of the code from the preceding iteration round enter the first unit as an input. The weight coefficient arrives from the output of the second unit B 212 through a de-interleaver 214. At the output of the first unit A 210, there are a new extrinsic weight coefficient $E_k$, which is applied to the second unit 212 as an input through an interleaver 216, and an output A comprising a soft decision, which is applied to other parts of the receiver, if needed. The systematic part $S_k$ of the code through the interleaver 218 and the parity part P2$_2$ also enter the second unit B as an input. The output of the unit is formed by the new extrinsic coefficient E$_k$, which is applied to the first unit 210 through the de-interleaver 214, and by an output B comprising a soft decision, which output B is applied to other parts of the receiver, if needed.

In practice, the interleavers 216 and 218 are often implemented by means of one interleaver. Decoders may also be arranged in parallel. In such a case, the decoder units 210 and 212 are implemented by means of parallel decoders.

MaxLogMap computation performed in the decoder units comprises three main parts: forward-going computation of path metrics, backward-going computation of path metrics, and combination of the path metrics computed forwards and backwards in order to compute a new extrinsic weight coefficient and a soft decision. The new extrinsic coefficient is applied to the next iteration round to serve as an input parameter, and a hard bit decision is made from the sign of the soft decision.

Let us now study an example of decoder operation. It is to be noted that, as is obvious to a person skilled in the art, the arithmetical operations presented only represent one way to implement the desired computation. The solution according to the invention may also be applied in other decoding computation methods. For example, various correction terms may be used. Let us consider path metrics of state S of $\alpha_k(s)$ turbo code encoder at time k, k=0, 1, 2, . . . , N, where N denotes the length of the uncoded (original) data block, the potential states being s=0, 1, 2, 3, 4, 5, 6, and 7. Depending on the encoding method, the initial state of the encoder is either known in the receiver or it has to be estimated. In this example, it is assumed that the initial state is known and it is s=0. Hereby, path metrics computation going forwards in the trellis may be initialized as follows:

$\alpha_0(0)=10000$, and $\alpha_0(s)=-\alpha_0(0)$ for each state $s=1, 2, 3, 4, 5, 6, 7$.

The branch metrics of the allowed state transition between the states of the encoder and between state s' of time k and state s of time k+1 are denoted by $\gamma_k(s',s)$, and they may be given a numerical value in connection with MaxLogMap in the case of one parity as follows:

$\gamma_k(s',s)=(X_k(S_k+E_k)+y_kP_k)/2$, where $x_k=1$ if the state transition between states s' and s is brought about by a zero bit and $x_k=-1$ if the state transition between states s' and s is brought about by a one bit. Correspondingly, if $y_k=1$ if the parity bit between states s' and s is a bit having a value of 0 ("a zero bit") and $y_k=-1$ if the parity bit of the state transition between states s' and s is a bit having a value of 1 ("a one bit"). Here, $S_k$ denotes the received numerical value of the systematic part of the turbo code, which value may be in an interleaved or direct order relative to time, depending on the stage of the decoding; $E_k$ refers to the numerical value of the extrinsic weight coefficient, which value may also be in an interleaved or direct order; and $P_k$ is that parity part of the code whose turn it is to decode, $P_k$ being always read in a direct order. It is assumed here that the modulation in question maps the zero bit as value 1 and the one bit as value −1.

The path metrics going forwards are computed by the formula $\alpha_{k+1}(s)=\max(\alpha_k(s')+\gamma_k(s',s))$ when k=0, 1, 2, . . . N−1.

That is, the value of the path metrics $\alpha_{k+1}(s)$ is selected to be equal to the largest path metrics entering the state s at the time k+1 from those states s' of the time k that allow transition forwards into the state s of the time k+1, the allowed state transitions being determined by the code used.

The backward-going path metrics $\beta_k(s')$ are computed as follows:

$\beta_N(0)=10000$ and $\beta_N(s)=-\beta_N(0)$, when s=1, 2, 3, 4, 5, 6, and 7;

and $\beta_k(s')=\max(\beta_{k+1}(s)+\gamma_k(s',s))$ when k=N−1, N−2, . . . , 1, 0.

Here, too, but backwards, the value of the path metrics $\beta_k(s')$ is selected to be equal to the largest path metrics entering the state s' at the time k from those states s of the time k+1 that allow transition backwards into the state s' of the time k.

The parity part of branch metrics $\gamma_k(s',s)$ of the encoder is denoted by $\lambda_k(s',s)$, $\lambda_k(s',s)=(y_kP_k)/2$ where $y_k=1$ if the parity bit of the allowed state transition between the state s' of the time k and the state s of the time k+1 is a zero bit and $y_k=-1$ if the parity bit in question is a one bit.

The weight coefficient $O_k$ of time k for the zero bit is computed by the formula $O_k=\max(\alpha_k(s')+\lambda_k(s',s)+\beta_{k+1}(s))$ when k=0, 1, 2, . . . , N−1, where the greatest sum is selected as the weight coefficient $O_k$ out of all sums corresponding to the state transitions brought about by the zero bit between the states s' of the time k and the states s of the time k+1. Correspondingly, the weight coefficient $Y_k$ of the zero bit of time k is computed by the formula $Y_k=\max(\alpha_k(s')+\lambda_k(s',s)+\beta_{k+1}(s))$ when k=0, 1, 2, . . . , N−1, where the greatest sum is selected as the weight coefficient $Y_k$ out of all sums corresponding to the state transitions brought about by the one bit between the states s' of the time k and the states s of the time k+1.

The new extrinsic weight coefficient uE$_k$ at time k is computed by the formula $uE_k=O_k-Y_k$, and the weight coefficient $B_k$ of the soft decision by the formula $B_k=S_k+E_k+uE_k$, where $E_k$ is the extrinsic weight coefficient of the preceding round. If $B_k$ is equal to or greater than zero, the zero bit is set as the received bit, in other cases the one bit. The sum $(S_k+E_k)$ is called an intrinsic weight coefficient, and the new extrinsic weight coefficient uE$_k$ is set as an input parameter for the next decoding round.

Figure 3:
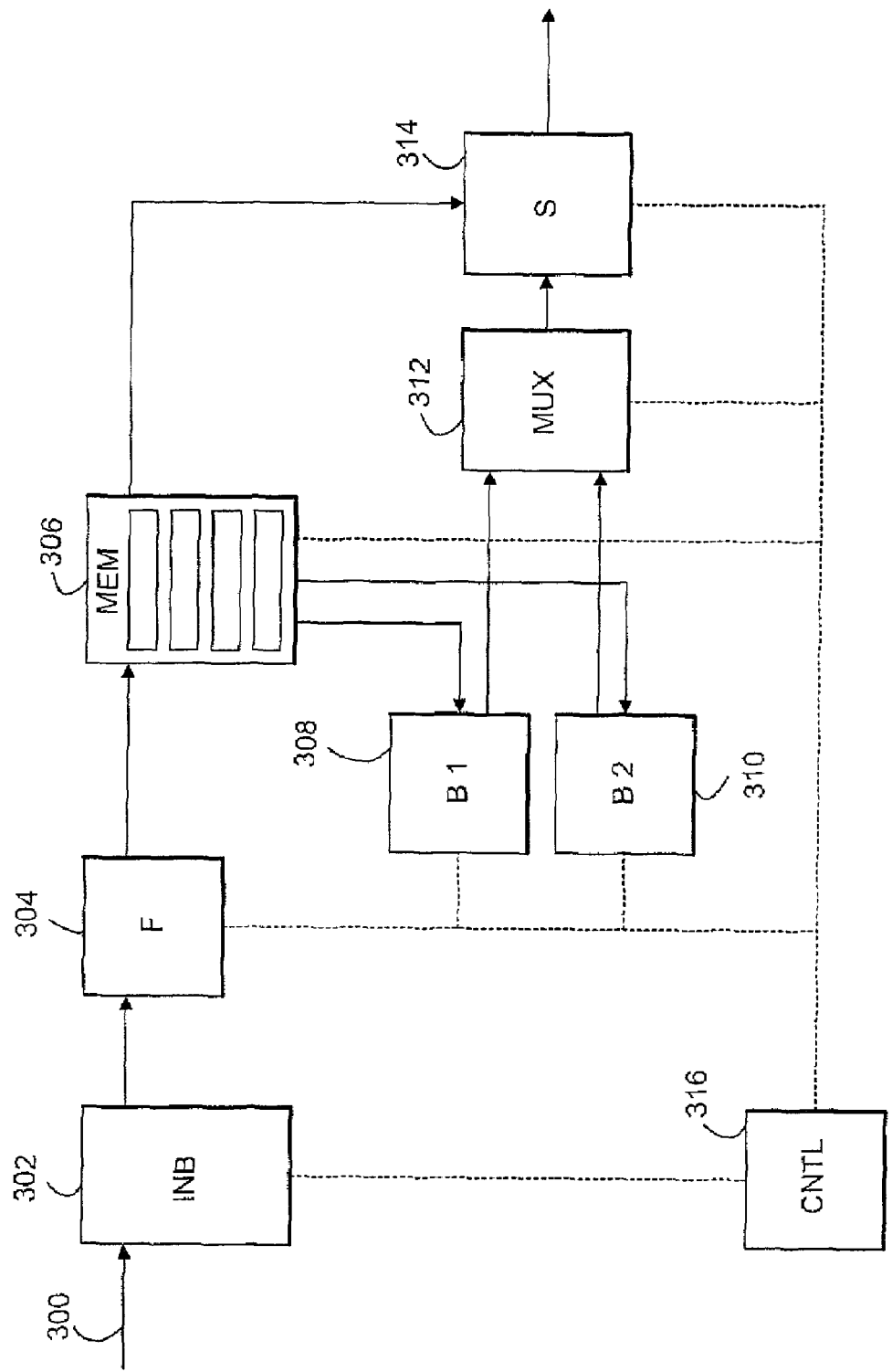
FIG. 3 illustrates a decoder solution according to preferred embodiments of the invention.

FIG. 3 illustrates a decoder solution according to preferred embodiments of the invention. The signal 300 to be decoded is applied to a first memory element, i.e. an input buffer 302. The signal comprises a systematic part S and parity parts P1 and P2, as described earlier. In the forward-direction, a unit 304 computing path metrics reads data from the buffer memory. The unit stores data in a second memory element 306. The memory element 306 has four parts, the use of which will be described later. The decoder comprises two other computation units 308, 310 performing backward-computation of path metrics. The inputs of these computation units are connected to the second memory element 306, from where they read the data the unit 304 has processed, as will be described later. The outputs of the computation units 308, 310 are connected to a multiplexer 312. The decoder further comprises a synthesis unit 314, which computes on the basis of the path metrics a soft decision, a hard decision and a new extrinsic weight coefficient for the next iteration round. The input of the synthesis unit is formed by the outputs from the second memory element and the multiplexer. The decoder also comprises control logic 316, which controls the operation of the different parts, such as the use of the second memory element 306, and the multiplexer in such a way that the outputs of the computation units 308, 310 are applied to the synthesis unit in turn. The connection may also be implemented in another way without a multiplexer.

Let us now consider a solution according to a preferred embodiment of the invention for performing decoding in a decoder unit according to FIGS. 2b and 3, which decoder comprises a computation unit (F) 304 performing forward-computation of path metrics, two computation units (B1, B2), 308, 310 performing backward-computation of path metrics, a synthesis unit (S) 314 and a four-bank memory element (M0, M1, M2 and M3) 306. Let us assume in this example that the length of the sliding window used is 128 and the length of the learning period 32. However, the solution is not limited to these values, as is obvious to a person skilled in the art.

The unit computing forwards continuously performs computation at the beginning of the sliding window, while, taking turns, one of the units computing backwards performs the learning period, i.e. the warm-up period, and the other performs useful computation. The backward-computing units use the values in the memory element as their input. The reading directions of the memory element always stay the same.

Figure 4:
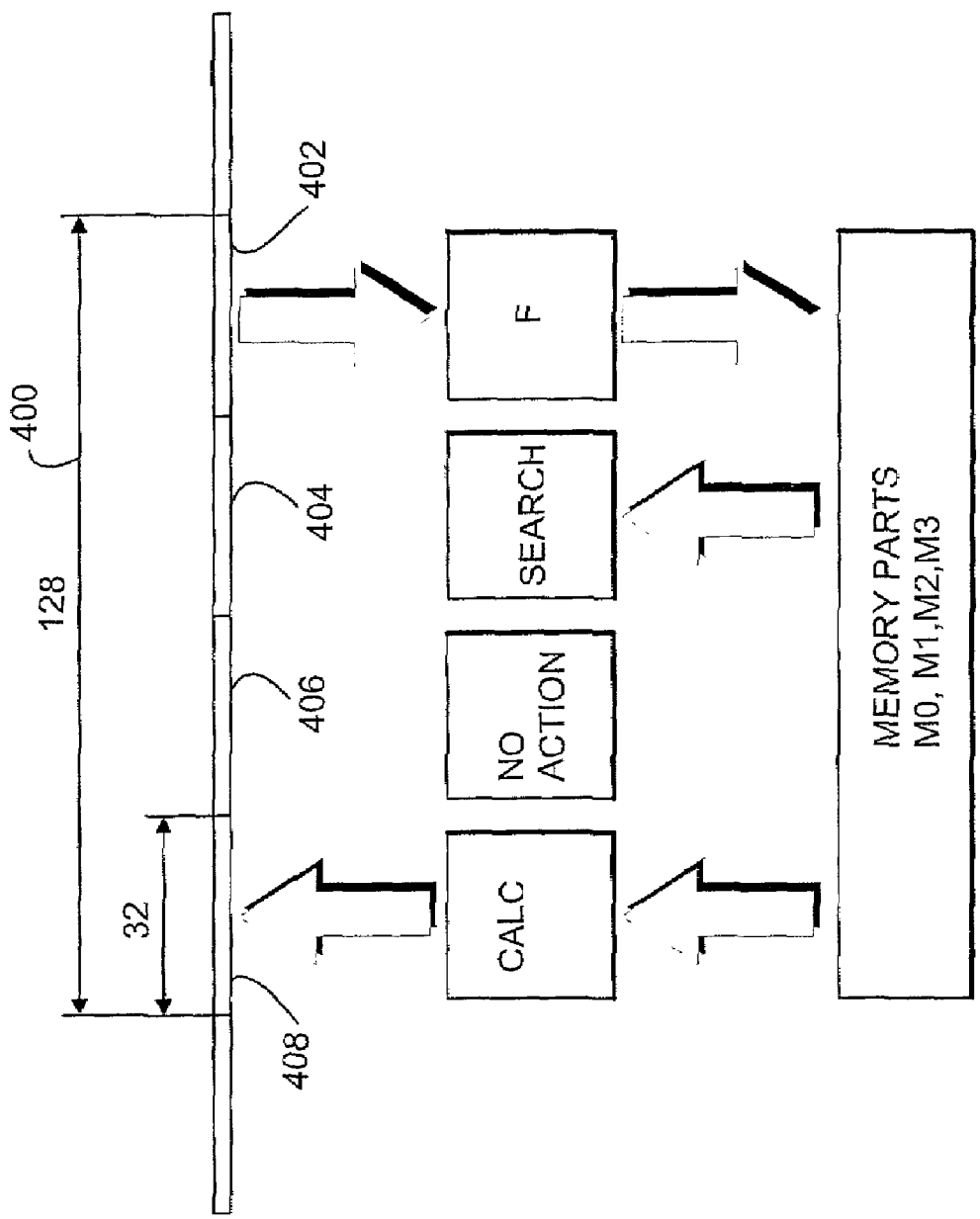
FIG. 4 illustrates a sliding window.

The method is illustrated by FIG. 4. The figure shows a sliding window 400, the length of which is in this example 128, as mentioned above. The sliding window is divided into four parts 402 to 408, the length of each part being 32. In the first part 402 of the sliding window, computation is performed in the forward-direction, i.e. from left to right. The data is read from the first memory, and the resulting data is stored in one of the parts M0 to M4 of the second memory. In the second window 404, the computation unit performs the learning period, reading data from one of the parts M0 to M4 of the second memory. This computation proceeds from right to left. There are no activities in the third part 406 of the window, whereas in the fourth part, actual computation is performed reading data from one of the parts M0 to M4 of the second memory. This computation also proceeds from right to left. The use of the different parts of the memory will be described in more detail later. Finally, the sliding window is moved by one quarter step to the right.

The systematic samples $S_k$ and the extrinsic weight coefficients $E_k$ computed during the preceding round are read in in a direct or interleaved order, depending on the round in question. The parity samples, by contrast, always arrive in a direct order but from two different parity data memories, corresponding to two component codes of a turbo code. In a serial implementation, one parity memory is used in one round and the other parity memory in the next round, taking turns. In an implementation with parallel decoders, both decoders always use the same parity part. Both parities are therefore denoted by $P_k$.

The forward-going computation unit (F) 304 of path metrics reads its input data in accordance with the control of the control unit and computes the path metrics following the allowed state transitions of the code. The numerical values of the path metrics and other data required are directed into one of the four parts M0, M1, M2 and M3 of the second memory element. At each particular time k, the part of the memory to be used is determined according to time k as follows:

the number of the part of the second memory in use is (k div 32) modulo 4.

Here, a div b refers to the integer part of quotient a/b. The number of a cell of this part of the second memory to store output records at time k is (k modulo 32).

One memory cell comprises the following information: the forward-going path metrics, the intrinsic weight coefficient, the numerical value of the parity and the address of the memory location from where the extrinsic weight coefficient was retrieved:

$\alpha_k(0), \alpha_k(1), \alpha_k(2), \alpha_k(3), \alpha_k(4), \alpha_k(5), \alpha_k(6), \alpha_k(7)$ (path metrics)

$(S_k+E_k)$ (intrinsic weight coefficient (sum as computed))

$P_k$ (parity)

index (k or the $k^{th}$ element of the interleaver)

Simultaneously with the forward-going computation of path metrics, the second backward-going computation unit of path metrics performs the learning period. If (k div 32) is even, the learning period is performed by B1 308, whereas with the odd values the learning period is performed by B2 310. The backward-going computation performing the learning period reads its input data from the part number ((k div 32)+3) modulo 4 of the second memory from the memory location 31−(k modulo 32).

The backward-going path metric values which have been computed during the learning period are not utilized, but the aim is to store the path metric values corresponding to the last index of the period to be used as an estimate of the correct values for the path metrics. This can be implemented in such a way, for example, that the utilization of the path metrics begins at the last numerical values.

Further, simultaneously with the preceding functions, the second backward-going computation of path metrics, which is B1 if (k modulo 32) is odd and B2 if it is even, reads its input data from the part number ((k div 32)+1) modulo 4 of the second memory from the memory location 31−(k modulo 32), sends the current path metrics computed backwards simultaneously with the numerical values of forward-going path metrics in the above-mentioned memory location and with other data further to the unit (S), and computes new backward-going path metrics by means of the input data. The synthesis unit (S) 314 computes a new extrinsic weight coefficient and stores it in the memory, in the location index, from where the corresponding preceding extrinsic weight coefficient was retrieved, for the following round. The unit (S) also computes the weight coefficient of the soft decision, the sign of which determines the hard decision of the round.

There are no activities in the part of the second memory of number ((k div 32)+2) modulo 4, and the use of the memory banks changes after each period of 32. All backward-going path metrics are initialized for the learning period to be equal, for example zero, except at the end of the data block, where the learning period is not required, because the encoder is assumed to finish at a zero state, whereby the zero state metrics are emphasized more than other metrics. In connection with the termination of what is called a cyclic trellis, the learning period is also performed at the end of the data block.

Computation of backward-going path metrics is re-initialized after each period of 64, whereby it is in the warm-up mode during the next 32 samples, in other words it is performing the learning period, after which it begins to produce usable data for computation of a new extrinsic weight coefficient, a soft decision or a hard decision.

At the initial situation, the first useful learning period starts at time k=64, and the next starting times of the learning period are k=64+n*32, n=0, 1, 2, 3, . . . . Unit B1 starts the learning period at times k=(n+1)*64, and unit B2 starts the learning periods at times k=(n+1)*64+32.

TABLE 1

| State | M0 | M1 | M2 | M3 |
|-------|-----|-----|-----|-----|
| 00 | F | B2 | | B1$_{CS}$ |
| 01 | B2$_{cs}$ | F | B1 | |
| 10 | | B1$_{CS}$ | F | B2 |
| 11 | B1 | | B2$_{CS}$ | F |

The above Table 1 illustrates the use of the parts of the second memory by means of a state machine during decoding. The left column illustrates the different states of the state machine in binary form. The above states are defined by the equation state=($k$ div 32) modulo 4.

Columns M0, M1, M2 and M3 contain the information on which computation unit is processing which part of the second memory at a particular time. The computation unit F computing path metrics forwards stores into the second memory, and the computation units computing path metrics backwards read from the second memory.

The unit computing forwards in state 00 stores into the part M0 of the second memory. The backward-computing unit B2 reads data from the part M1 and performs useful computation. There are no activities in the part M2 of the second memory. The backward-computing unit B1 reads data from part M3 and is at the warm-up stage (B1$_{CS}$).

The unit computing forwards in state 01 stores into the part M1 of the second memory. The backward-computing unit B2 reads data from the part M0 and is at the warm-up stage (B2$_{CS}$). The backward-computing unit B1 reads data from the part M2 and performs useful computation. There are no activities in the part M3 of the second memory.

The unit computing forwards in state 10 stores into the part M2 of the second memory. The backward-computing unit B1 reads data from the part M1 and is at the warm-up stage. The backward-computing unit B2 reads data from the part M3 and performs useful computation. There are no activities in the part M0 of the second memory.

The unit computing forwards in state 11 stores into the part M3 of the second memory. The backward-computing unit B1 reads data from the part M0 and performs useful computation. There are no activities in the part M1 of the second memory. The backward-computing unit B2 reads data from the part M2 and is at the warm-up stage.

When an example of a general situation is studied, the length of the quarter window is denoted by L and the length of the learning period by W. These may be of different lengths, for example L=2*W, whereby the size of the parts of the memory is doubled but the number of the learning periods to be performed is reduced. However, L≧W. As regards the implementation, powers of two are preferable, because then the computation of the required control information is simple, for example L=W=32 or L=64 and W=32.

Thus, it is marked

L=length of the quarter window
W=length of the learning period
N=number of the bits to be decoded, k=0, 1, 2, . . . , N−1

The forward-going path metrics are written together with other data in the record in the part number (k div L) modulo 4 of the second memory using the address k modulo L.

The learning period is performed by B1 always when the (k div L) is even, and B1 starts the learning period when k=(n+1)*2*L+L−W, where n=0, 1, 2, . . . . The part of the second memory in use for the learning period is (k div L+3) modulo 4 and the addresses L−1−(k modulo L).

Correspondingly, the learning period is performed by B2 always when (k div L) is odd, and B2 starts the learning period when k=(n+1)*2*L+2*L−W, where n=0, 1, 2, . . .

Useful backward-going path metrics are produced by B1 when (k div L) is odd, and correspondingly by B1 when (k div L) is even. The part of the second memory used in the useful period is (k div L+1) modulo 4 and addresses L−1−(k modulo L).

When the symbols to be decoded run out, the decoding must be stopped in a controlled manner, depending on the termination used in connection with the encoding. Let us consider, by way of example, stopping of conventional termination in a case where L=W=32. This takes place in such a way that the forward-computing unit stops its operation when k=N, but the backward-going units continue their operation, until k=K=N+31−[(N−1) modulo 32]. After this, another backward-going unit, for example B1, jumps into the location N−1, and the path metrics that favour the code state zero are set as the initial values of the metrics to be computed backwards. Unit B2 is turned off. Next, unit B1 begins to compute metrics backwards from the part t=((N−1)div 32) modulo 4 of the second memory, continue to the part (t+3) modulo 4 of the second memory, and finally to (t+2) modulo 4. For example, if t=00, the parts of the second memory to be used are M0, M3 and M2. If the length of the block is below 65, the stopping order is always M1 and M0 or only M0 The memory cells are read in a descending order from each part of the second memory during the stop.

Termination in connection with what is called cyclic termination takes place as above, except that the initial values that the learning period gave at the beginning of the block in state 01 are set as the initial values of B1. In cyclic termination, there has to be one learning period more at the beginning than in conventional termination.

When there is no termination at all, the stopping takes place in connection with conventional termination, but values favouring all path metrics equally are set as the initial values of B1.

While the invention has been described above with reference to the example according to the attached drawings, it is obvious that it is not limited thereto but may be modified in many ways within the inventive idea defined by the attached claims.

The invention claimed is:

1. A method of decoding a convolutionally encoded codeword by means of a window sliding over the codeword, which method comprises computation of path metrics simultaneously forwards and backwards in the sliding window, the method further comprising the steps of
   a) using a four-part sliding window comprising four successive parts;
   b) computing path metrics in the forward direction in the first part of the four successive parts of the sliding window and storing path metrics in a four-part memory;

c) computing path metrics in the backward direction in two other parts of the sliding window in such a way that an input for a computation unit comes from the four-part memory;
d) taking the computed metrics to a synthesis unit and computing a decoding result;
e) moving the sliding window one part forwards; and
f) repeating the preceding steps a) to e);
wherein a part of the four-part memory is identified by the mathematical expression "(k div L)", wherein a location within the four-part memory is identified by the mathematical expression "(k modulo L)", and the computation unit computes path metrics in the forward direction at each particular time k and stores the path metrics into a memory location (k modulo L) of the memory part (k div L) modulo 4, L being the length of the quarter of the sliding window.

2. A method according to claim 1, wherein in the step of storing in the memory location the forward-computed path metrics, the path metrics include an intrinsic weight coefficient, and a numerical value of the parity and the address of the memory location from which the extrinsic weight coefficient was retrieved.

3. A method of decoding a convolutionally encoded codeword by means of a window sliding over the codeword, which method comprises computation of path metrics simultaneously forwards and backwards in the sliding window, the method further comprising the steps of
a) using a four-part sliding window comprising four successive parts;
b) computing path metrics in the forward direction in the first part of the four successive parts of the sliding window and storing path metrics in a four-part memory;
c) computing path metrics in the backward direction in two other parts of the sliding window in such a way that an input for a computation unit comes from the four-part memory;
d) taking the computed metrics to a synthesis unit and computing a decoding result;
e) moving the sliding window one part forwards; and
f) repeating the preceding steps a) to e);
wherein a memory element of the four-part memory is identified by the mathematical expression "(k div L+3) modulo 4", wherein a step of computing path metrics in the backward direction is accomplished in a warm-up period, and input data is retrieved at each particular time k from a memory element designated by (k div L+3) modulo 4, L being the length of a quarter of the sliding window.

4. A method of decoding a convolutionally encoded codeword by means of a window sliding over the codeword, which method comprises computation of path metrics simultaneously forwards and backwards in the sliding window, the method further comprising the steps of
a) using a four-part sliding window comprising four successive parts;
b) computing path metrics in the forward direction in the first part of the four successive parts of the sliding window and storing path metrics in a four-part memory;
c) computing path metrics in the backward direction in two other parts of the sliding window in such a way that an input for a computation unit comes from the four-part memory;
d) taking the computed metrics to a synthesis unit and computing a decoding result;
e) moving the sliding window one part forwards; and
f) repeating the preceding steps a) to e);
wherein a memory element of the four-part memory is identified by the mathematical expression "(k div L+1) modulo 4", and wherein during computation of backward-going path metrics, input data is retrieved at each particular time k from a memory element designated by (k div L+1) modulo 4, L being the length of a quarter of the sliding window.

5. A method of decoding a convolutionally encoded codeword by means of a window sliding over the codeword, which method comprises computation of path metrics simultaneously forwards and backwards in the sliding window, the method further comprising the steps of
a) using a four-part sliding window comprising four successive parts;
b) computing path metrics in the forward direction in the first part of the four successive parts of the sliding window and storing path metrics in a four-part memory;
c) computing path metrics in the backward direction in two other parts of the sliding window in such a way that an input for a computation unit comes from the four-part memory;
d) taking the computed metrics to a synthesis unit and computing a decoding result;
e) moving the sliding window one part forwards; and
f) repeating the preceding steps a) to e);
wherein a part of the four-part memory is identified by the mathematical expression "(k div L+1) modulo 4", the method further comprising the step of connecting the part (k div L+1) modulo 4 of the four-part memory to one of the inputs of the synthesis unit, L being the length of a quarter of the sliding window.

* * * * *